US006969841B2

(12) United States Patent
Harris

(10) Patent No.: US 6,969,841 B2
(45) Date of Patent: Nov. 29, 2005

(54) METHOD AND APPARATUS FOR SECURING MICROELECTRONIC WORKPIECE CONTAINERS

(75) Inventor: Randy A. Harris, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 271 days.

(21) Appl. No.: 10/622,018

(22) Filed: Jul. 16, 2003

(65) Prior Publication Data

US 2004/0089823 A1     May 13, 2004

Related U.S. Application Data

(60) Provisional application No. 60/396,894, filed on Jul. 16, 2002.

(51) Int. Cl.[7] .............................................. H01J 40/14
(52) U.S. Cl. .................................. 250/221; 250/559.33
(58) Field of Search ............................ 250/221, 559.3, 250/559.33; 414/744.5, 744.2, 744.4, 919

(56) References Cited

U.S. PATENT DOCUMENTS 6,878,955 B2 * 4/2005 Harris et al. ............ 250/559.33

* cited by examiner

*Primary Examiner*—Que T. Le
(74) *Attorney, Agent, or Firm*—Perkins Coie LLP

(57) ABSTRACT

An apparatus and method for handling microelectronic workpiece containers. In one embodiment, the apparatus includes a container support having one or more support elements positioned to carry a microelectronic workpiece container. A container securement device is positioned at least proximate to the support element(s). A contact surface of the securement device is moved in a first direction so that it contacts or is positioned to contact a surface of the workpiece container. The contact surface is then moved in a second direction different that the first direction to clamp the workpiece container against the support element(s).

29 Claims, 6 Drawing Sheets

METHOD AND APPARATUS FOR SECURING MICROELECTRONIC WORKPIECE CONTAINERS

CROSS-REFERENCE TO RELATED APPLICATIONS

This application claims benefit of U.S. Provisional Patent Application No. 60/396,894, filed Jul. 16, 2002 incorporated herein in its entirety by reference.

TECHNICAL FIELD

The present invention is directed generally to methods and apparatuses for securing microelectronic workpiece containers, for example, methods and apparatuses for securing FOUP containers while the containers are accessed.

BACKGROUND

Microelectronic devices, such as semiconductor devices and field emission displays, are typically fabricated on and/or in microelectronic workpieces using several different types of process machines or tools. A workpiece, for example, is often processed using tools for depositing, implanting, diffusing, doping, etching, polishing/planarizing, and patterning materials. A workpiece typically undergoes several processing steps within a single enclosed clean or "mini" environment within a processing tool. For example, microelectronic workpieces are typically plated with a conductive material, etched, annealed and cleaned, using a plurality of processing stations all housed within a single processing enclosure that defines a clean mini environment.

The foregoing processes can be performed on each workpiece individually in separate single-wafer processing stations, and the workpieces can be moved from one processing station to the next, a technique referred to in the industry as single-wafer processing. One initial problem encountered with single-wafer processing was determining how to deliver individual workpieces to and from the enclosure while maintaining a clean environment within the enclosure. One approach to addressing this problem has been to load several workpieces in a portable container while the container is in a clean environment, and then seal the container with a removable door. Accordingly, the interior of the container can define another clean mini environment. The door is then removed when the container is flush with a hatch of the processing enclosure to reduce the likelihood for introducing contaminants into the enclosure.

FIG. 1 illustrates a conventional container 20 having a Front Opening Unified Pod (FOUP) design in accordance with the prior art. The container 20 supports a plurality of microelectronic workpieces 21 and has a door 23 that is removed for access to the interior of the container 20. The container 20 is supported relative to a processing tool (not shown) on a container support 30. The container support 30 has a shroud 31 with openings 33 through which support pins 34 and a latch pin 40 project to engage and secure the container 20 to the container support 30.

In one aspect of the arrangement shown in FIG. 1, the latch pin 40 includes outwardly extending arms 41, each of which has a downwardly facing, circumferentially extending declined plane. The arms 41 project through a corresponding aperture in the bottom of the container 20 when the container 20 is placed on the shroud 31. As the latch pin 40 rotates in the direction indicated by arrow A, the downwardly facing declined planes begin to engage an upwardly facing surface in the aperture at the base of the container 20. Because the downwardly facing surfaces of the arms 41 are in declined, the latch pin 40 draws the container 20 downwardly toward the support pins 34 as the latch pin 40 rotates, to secure the container 20 to the container support 30.

One drawback with the foregoing design described above with reference to FIG. 1 is that the manufacturing tolerances for the container 20, and in particular, the portion of the container 20 engaged by the latch pin 40, must be very tight for the latch pin 40 to properly secure the container. For example, if the base of the container is slightly warped, the latch pin 40 may be unable to properly engage the aperture in the base, or may only loosely contact the upwardly facing surface within the aperture. If the container 20 is not properly secured on the container support 30, it can be jarred or otherwise misaligned, which can cause damage to the microelectronic workpieces 21 when automatic devices attempt to load or unload the container 20.

SUMMARY

The present invention is directed toward methods and apparatuses for securing microelectronic workpiece containers. One aspect of several embodiments of the invention includes securing a workpiece container to a container support with a device that executes motion in two different directions, one to align a portion of the device in contact with or poised to contact the container, and another to draw the container against the container support. Accordingly, the securement device can positively engage containers that may be warped or have other irregularities because the motion to align the device need not use up the limited travel range available for also securing the container to the support.

For example, in a particular aspect of the invention, the apparatus includes a container support having one or more support elements positioned to carry a microelectronic workpiece container. A container securement device is positioned at least proximate to the support element(s) and has at least one contact surface. The at least one contact surface is movable relative to the support element(s) in a first direction between a first position and a second position, with the contact surface contacting or positioned to contact a surface of the container when in the second position. The contact surface is also movable in a second direction from the second position to a third position with the contact surface clamping the container against the support element(s). The second direction is different than the first direction, which as described above, can allow the device to more readily secure workpiece containers that may be warped or otherwise misshapen.

In further particular aspects of the invention, the at least one contact surface is one of at least two contact surfaces. The contact surfaces are pivotable between the first position and the second position and are movable along a generally linear axis from the second position to the third position. In still a further particular aspect of the invention, the securement device is configured to move the at least one contact surface in the first direction without moving the at least one contact surface in the second direction.

A method in accordance with another aspect of the invention includes contacting a microelectronic workpiece container with at least one support element of a container support. The method further includes moving a contact surface of a securement device in a first direction from a first position to a second position with the contact surface contacting or positioned to contact a surface of the container when in the second position. The container is then drawn toward the at least one support element with a second motion of the contact surface in a second direction different than the first direction. In further particular aspects of the invention, the contact surface is pivoted in the first direction and is moved along a generally linear path in the second direction.

DETAILED DESCRIPTION

The following description discloses the details and features of several embodiments of methods and apparatuses for handling microelectronic workpiece containers. The term "microelectronic workpiece" is used throughout to include a workpiece formed from a substrate upon which, and/or in which, features, such as submicron features, including microelectronic circuits or components, data storage elements or layers, and/or micro-mechanical elements are fabricated. It will be appreciated that several of the details set forth below are provided to describe the following embodiments in a manner sufficient to enable a person skilled in the relevant art to make and use the disclosed embodiments. Several of the details and advantages described below may not be necessary to practice certain embodiments of the invention. Additionally, the invention can include other embodiments that are within the scope of the invention but are not described in detail with respect to the FIGS. 2–6.

Figure 2:
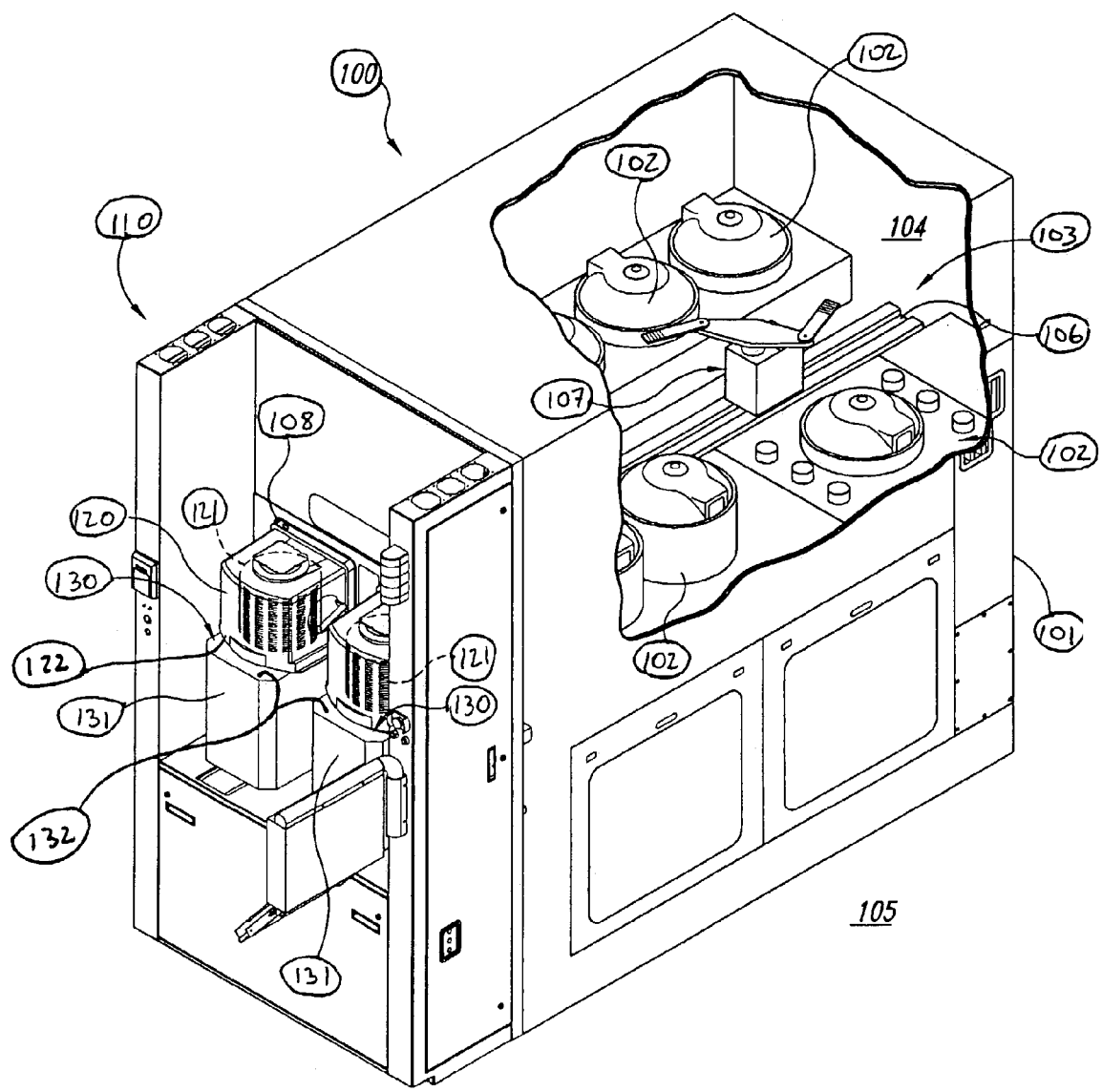
FIG. 2 is an isometric view of a processing machine or tool having a container support in accordance with an embodiment of the invention.

FIG. 2 is an isometric view of a processing machine or tool 100 having an input/output station 110 that includes container supports 130 in accordance with an embodiment of the invention. A portion of the processing tool 100 is shown in cut-away view to illustrate selected internal components including a plurality of processing stations 102. In one aspect of this embodiment, the processing tool 100 includes a cabinet 101 defining an enclosure that at least partially isolates an interior region 104 from an exterior region 105. The cabinet 101 also includes a plurality of apertures 108 (one of which is visible in FIG. 2) through which microelectronic workpieces move as they are transferred between the interior region 104 and the input/output station 110.

In one embodiment, the input/output station 110 includes two container supports 130, each housed in a protective shroud 131. In other embodiments, the input/output station 110 includes more or fewer container supports 130. In any of these embodiments, the container supports 130 are configured to position workpiece containers 120 relative to the apertures 108 in the cabinet 101. Accordingly, each shroud 131 includes an upper surface 132 proximate to a floor 122 of the workpiece container 120. Each workpiece container 120 houses a plurality of microelectronic workpieces 121 in a "mini" clean environment suitable for carrying a plurality of workpieces through other environments that are not at clean room standards. In one aspect of this embodiment, the workpiece container 120 includes a FOUP (Front Opening Unified Pod) device. Accordingly, the container 120 conforms with standards set forth by SEMATECH, or other semiconductor industry standards. In other embodiments, the container 120 is a non-standard device. In any of these embodiments, each of the workpiece containers 120 is accessible from the interior region 104 of the tool 100 through the apertures 108.

The interior region 104 of the tool 100 includes a plurality of the processing stations 102, such as electroless and/or electrolytic material deposition stations, clean/etch stations, annealing stations, metrology stations, and/or other processing stations. A transfer device 103 moves the microelectronic workpieces 121 between the input/output station 110 and the processing stations 102. In one embodiment, the transfer device 103 includes a linear track 106 extending in a lengthwise direction in the interior region 104 between the processing stations 102. The transfer device 103 includes a robot unit 107 carried by the track 106. In a particular embodiment shown in FIG. 2, the linear track 106 extends between first and second rows of processing stations 102, and the robot unit 107 moves the microelectronic workpieces 121 from the input/output station 110 to one or more of the processing stations 102 and back to the input/output station 110.

Figure 3:
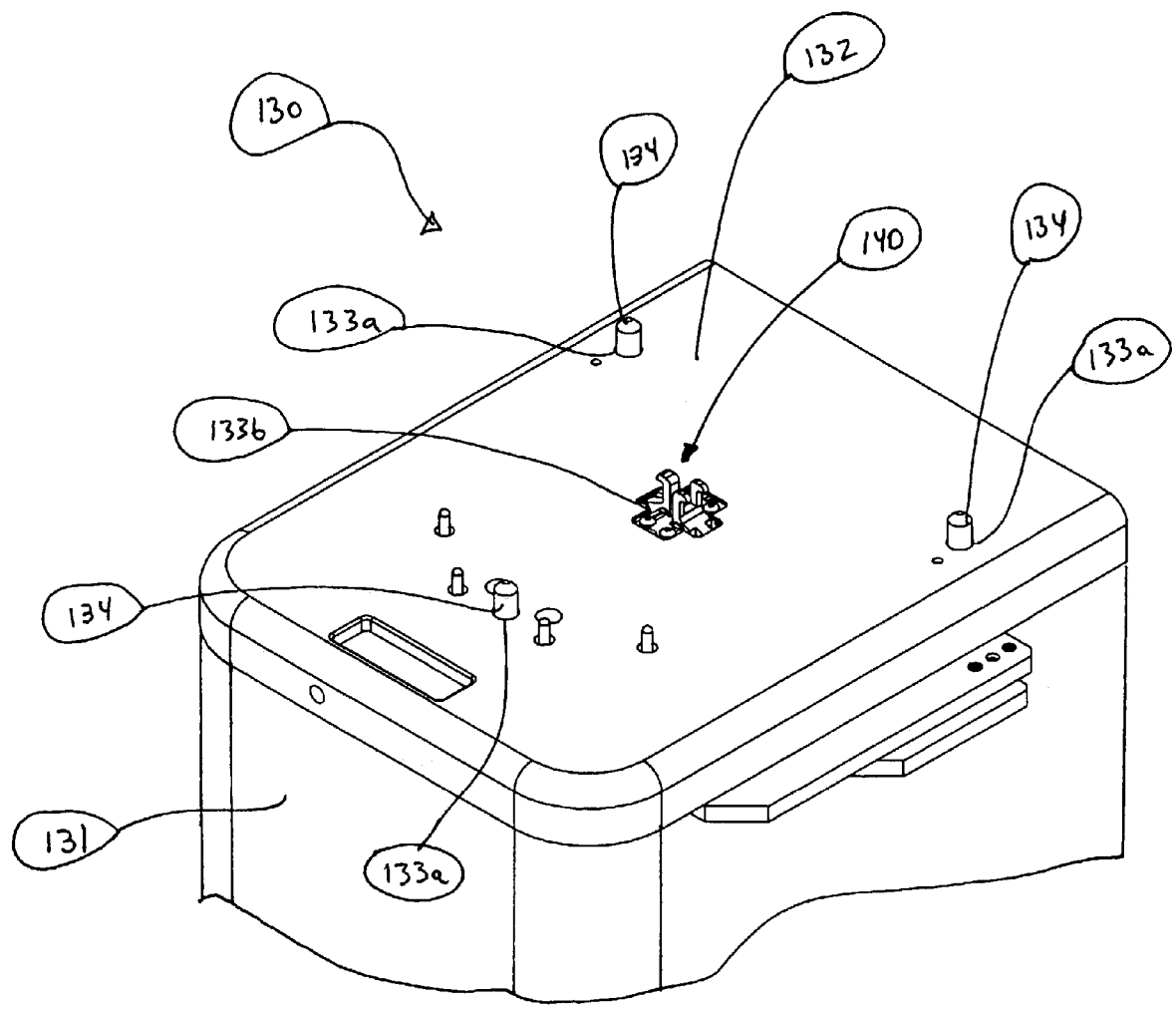
FIG. 3 is a top isometric view of a portion of a container support in accordance with an embodiment of the invention.

FIG. 3 is a top isometric view of a portion of one of the container supports 130 positioned at the input/output station 110 described above with reference to FIG. 2. In one aspect of this embodiment, the upper surface 132 includes a plurality of shroud apertures 133 (shown as first shroud apertures 133a and a second shroud aperture 133b) positioned to allow components within the shroud 131 to access the workpiece container 120. For example, in one embodiment, one or more support elements 134 (for example, pins) project upwardly through the first shroud apertures 133a to seat and align the workpiece container 120. In other embodiments, other surfaces seat the workpiece container 120. A securement device 140 projects upwardly through the second shroud aperture 133b to secure the workpiece container 120 to the container support 130.

Figure 4:
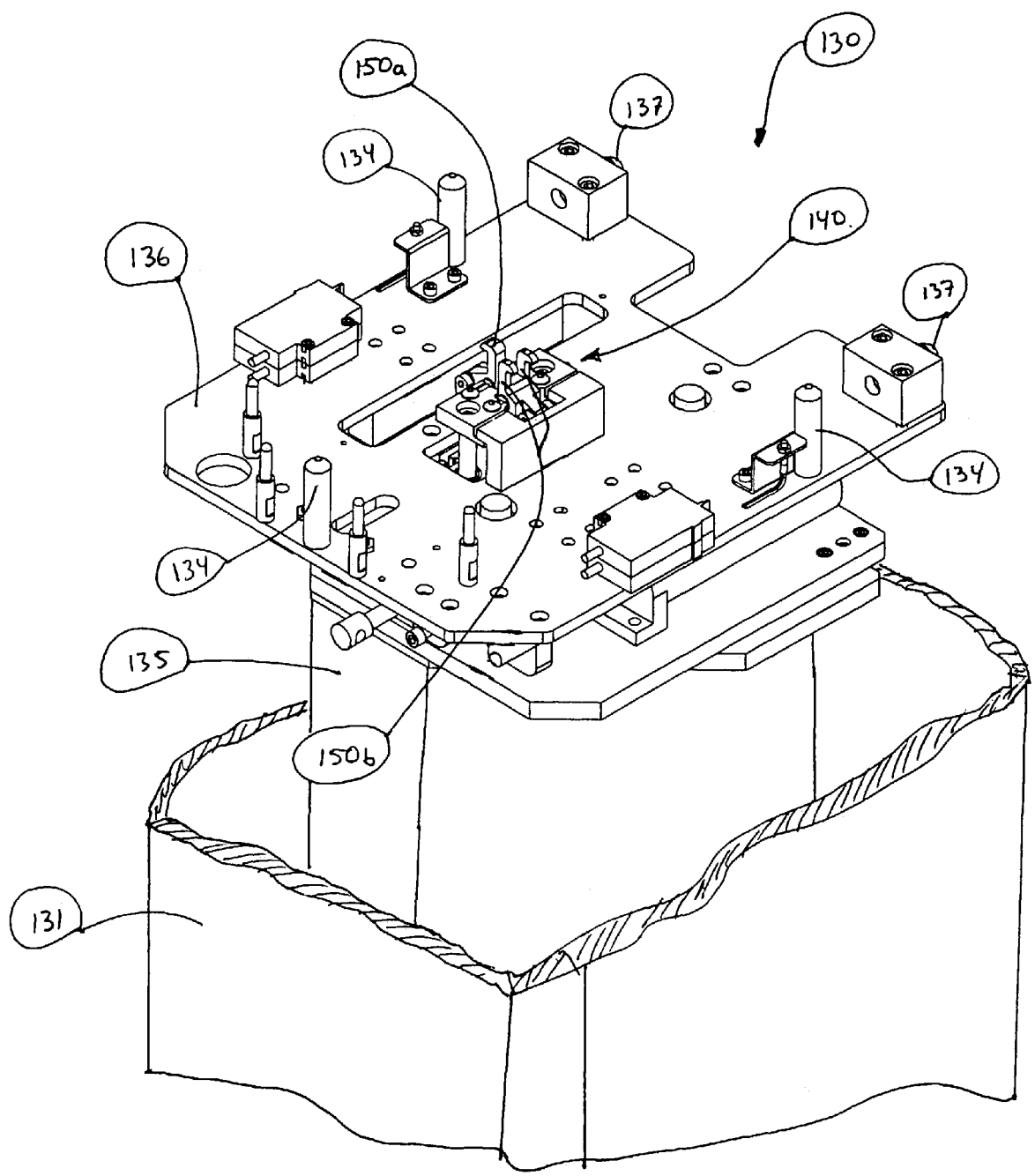
FIG. 4 is a top isometric view of an internal portion of an embodiment of the container support shown in FIG. 3.

FIG. 4 is a top isometric view of a portion of the container support 130 visible through a cut-away portion of the shroud 131. In one aspect of this embodiment, the container support 130 includes a platform 136 carried by a support column 135. The support column 135 moves upwardly and downwardly to position the workpiece container 120 (FIG. 2) for loading and/or unloading. The platform 136 includes alignment pins 137 that align the platform 136 with the aperture 108 (FIG. 2) of the cabinet 101 (FIG. 2).

In one embodiment, the platform 136 also supports the securement device 140. In one aspect of this embodiment, the securement device 140 includes grip members 150 (shown as a first grip member 150a and a second grip member 150b) that engage the workpiece container 120 and secure it to the container support 130. Further details of the structure and operation of an embodiment of the securement device 140 are described below with reference to FIGS. 5 and 6.

Figure 5:
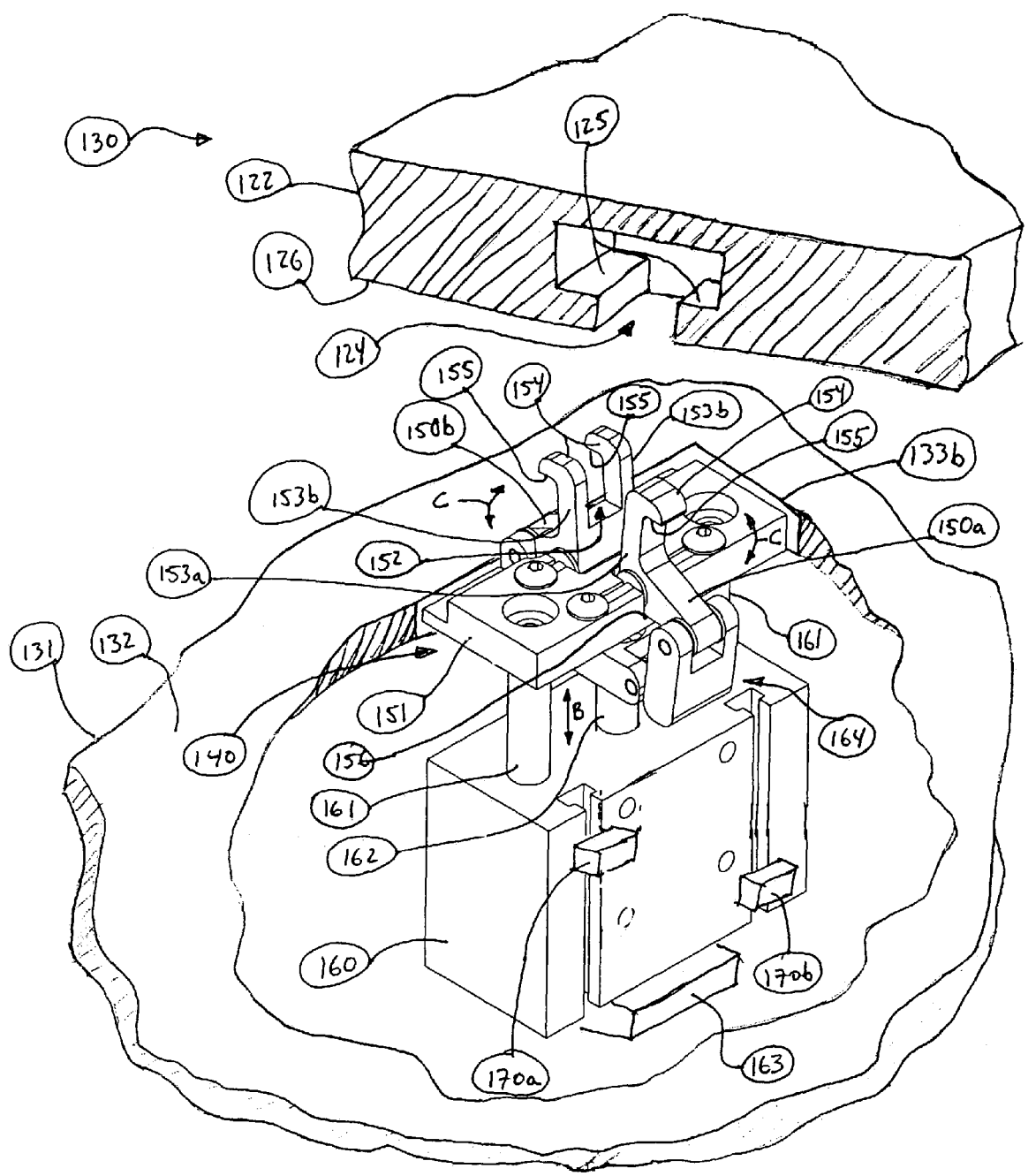
FIG. 5 is an enlarged, partially broken, isometric view of a portion of an embodiment of the container support shown in FIG. 3.

FIG. 5 is an enlarged, top isometric, partially schematic view of an embodiment of the securement device 140 and a portion of the shroud 131. A portion of the workpiece container 120 is also shown in FIG. 5. In one aspect of this embodiment, the floor 122 of the workpiece container 120 includes a floor aperture 124 extending from an external surface 126 of the floor 122 to an internal surface 125 (that can include shelf-like portions) positioned adjacent to the floor aperture 104. The grip members 150a, 150b of the securement device 140 are configured to extend upwardly through the floor aperture 124, engage the internal surface 125, and draw the outer surface 126 downwardly against the support elements 134 (FIG. 4).

In one embodiment, the first grip member 150a includes a first upwardly extending prong 153a and the second grip member 150b includes two upwardly extending prongs 153b. Each prong 153a, 153b has an outwardly extending contact portion 154 with a downwardly facing contact surface 155 configured to engage the inner surface 125 of the workpiece container 120. The grip members 150a and 150b are pivotable toward and away from each other as indicated by arrows C. When the grip members 150a, 150b are pivoted toward each other, the first prong 153a of the first grip member 150a fits into a slot 152 between the second prongs 153b of the second grip member 150b. When the grip members 150a, 150b are pivoted toward each other and nested in this manner, they can move axially upwardly through the floor aperture 124 of the workpiece container 120, with the contact portions 154 axially aligned with the floor aperture 124 and positioned above the level of the internal surface 125. When the first and second grip members 150a, 150b are rotated outwardly away from each other (to the position shown in FIG. 5) while positioned in the floor aperture 124, the contact surfaces 155 are positioned directly above the internal surface 125 of the workpiece container 120. The grip members 150a, 150b are accordingly positioned to grip the container 120 and draw the floor 122 of the container 120 downwardly against the support elements 134 (FIG. 4), as described in greater detail below.

In one embodiment, the grip members 150a, 150b are pivotally coupled to a grip member support 151. In a further aspect of this embodiment, the grip member support 151 is carried by a base 160 for linear axial motion, as indicated by arrow B. Accordingly, in yet a further aspect of this embodiment, the base 160 includes a linear actuator 163 coupled to the grip support 151 with an actuator shaft 162 to move the grip support member 151 axially upwardly and downwardly. The actuator 163 includes a pneumatic actuator in one embodiment, and in other embodiments, the actuator 163 includes other devices, such as hydraulic actuators, lead screws, or solenoids. In still a further aspect of these embodiments, the actuator shaft 162 is coupled to the grip members 150a, 150b with a linkage 164. When the actuator shaft 162 moves downwardly, the grip members 150a, 150b moved apart, and when the actuator shaft 162 moves upwardly, the grip members 150a, 150b move together.

In one embodiment, the securement device 140 further includes spring pins 161 connected between the grip member support 151 and the base 160. The spring pins 161 (or other biasing devices) tend to force the grip member support 151 upwardly away from the base 160. As the actuator shaft 162 moves downwardly, the spring pins 161 initially keep the grip member support 151 at the same elevation. Accordingly, the initial downward motion of the actuator shaft 162 causes the grip members 150a, 150b to pivot outwardly away from each other, without lowering the grip member support 151, until the grip members 150a, 150b contact corresponding upwardly facing stop surfaces 156 (one is visible in FIG. 5) of the grip support member 151. At this point, further downward motion of the actuator shaft 162 will not cause the grip members 150a, 150b to pivot outwardly any further. Instead, the grip members 150a, 150b bear downwardly against the upwardly facing stop surfaces 156, causing the entire grip member support 151 to move downwardly against the upward force provided by the spring pins 161. This motion causes the contact surfaces 155 of the grip members 150a, 150b to engage the upwardly facing interior surface 125 of the workpiece container 120, and draw the workpiece container 120 downwardly against the support elements 134 (FIG. 4).

In a further aspect of this embodiment, the securement device 140 includes one or more sensors 170 (two are shown in FIG. 5 as a first sensor 170a and a second sensor 170b) configured to detect the position of the grip member support 151. In one aspect of this embodiment, each sensor 170 is a magnetic sensor that detects the position of a magnet located on the actuator shaft 162 or one of the spring pins 161. In a particular embodiment, the first sensor 170a is triggered when the actuator shaft 162 is at its uppermost position, with the grip members 150a, 150b pivoted toward each other. For example, when the actuator shaft is in this position, a single magnet in the actuator shaft 162 is aligned with the first sensor 170a. The second sensor 170b detects the position of the magnet when the actuator shaft 162 has moved downwardly far enough to both engage the grip members 150a, 150b with the workpiece container 120, and draw the workpiece container 120 downwardly against the support elements 134 (FIG. 4). If neither the first sensor 170a nor the second sensor 170b are triggered, this indicates that either the actuator shaft 162 is stuck at an intermediate position, or the grip members 150a, 150b failed to engage the workpiece container 120, allowing the actuator shaft 162 to move downwardly beyond the point at which the magnet in the actuator shaft 162 triggers the second sensor 170b. In other embodiments, the securement device 140 includes other sensor arrangements.

Figure 6:
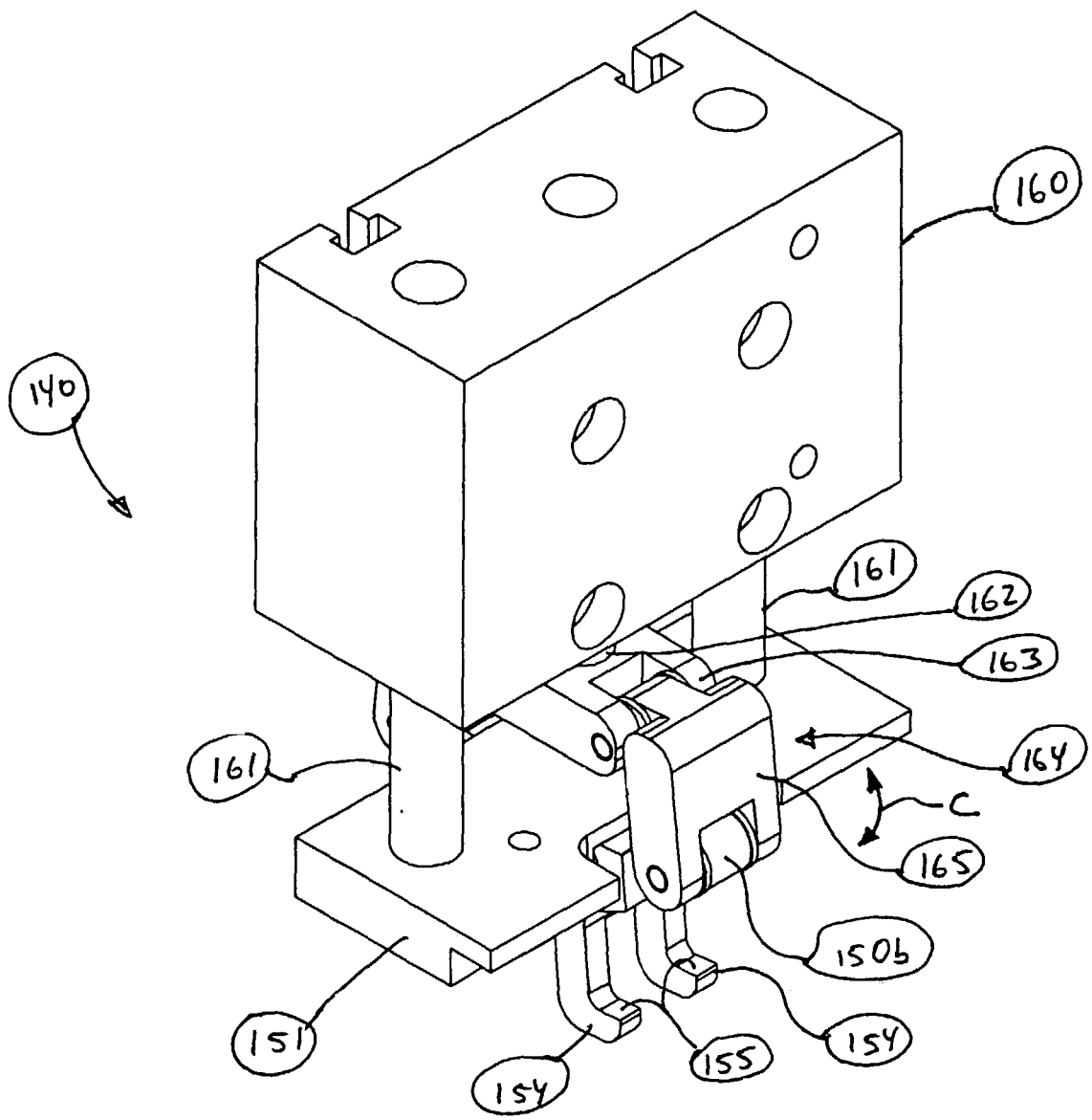
FIG. 6 is an inverted view of a portion of the container support shown in FIG. 5.

FIG. 6 is a bottom isometric view of the portion of the securement device 140 illustrating further details of the linkage 164 between the actuator shaft 162 and the grip members 150a, 150b (of which the second grip member 150b is visible). In one aspect of this embodiment, the linkage 164 includes a link support 163 extending outwardly from the actuator shaft 162. A link 165 is pivotably coupled between the link support 163 and the second grip member 150b to pivot the second grip member 150b inwardly and outwardly (indicated by arrow C), as the actuator shaft 162 moves axially (indicated by arrow B).

The operation of a securement device 140 in accordance with an embodiment of the invention is described below with reference to FIG. 5. To begin operation, the actuator shaft 162 is moved to its uppermost position, causing the grip members 150a, 150b to pivot toward each other so that the first prong 153a of the first grip member 150a fits into the slot 152 between the second prongs 153b of the second grip member 150b. The workpiece container 120 is then lowered onto the support surface 132 of the shroud 131 so that the grip members 150a, 150b project upwardly through the floor aperture 124. The actuator 163 is then activated to move the actuator shaft 162 axially downwardly, causing the grip members 150a, 150b to pivot outwardly away from each other until the grip members 150a, 150b engage the stop surface 156 of the grip member support 151. At this point, the contact surfaces 155 of the grip members 150a, 150b are positioned directly over the interior surface 125 of the workpiece container 120, or in contact with the interior surface 125.

The actuator shaft 162 continues to move downwardly, causing the grip member support 151 and the grip members 150a, 150b to move downwardly as a unit against the upward force provided by the spring pins 161. Accordingly, the downwardly facing contact surfaces 155 of the grip members 150a, 150b contact the upwardly facing interior surface 125 of the workpiece container 120, if they have not done so already. The actuator 162 continues to draw the grip member support 151 and the first and second grip members 150a, 150b downwardly to pull the floor 122 of the workpiece container 120 snugly against the support elements 134 (FIG. 4). This operation securely engages the workpiece container 120 with the container support 130. To release the container 120 from the container support 130, the foregoing steps are reversed.

Figure 1:
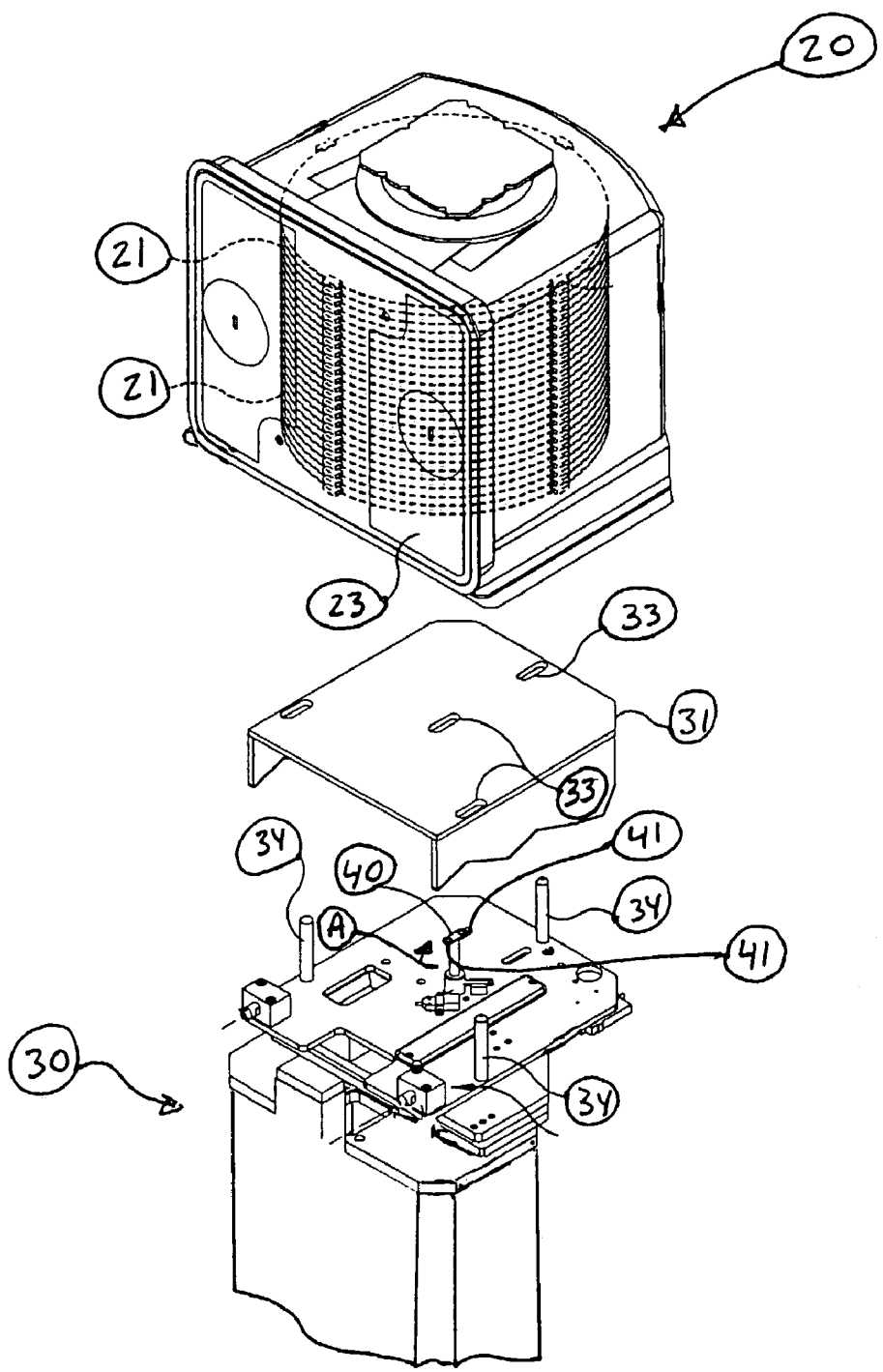
FIG. 1 is a partially exploded, top isometric view of a microelectronic workpiece container and container support having characteristics in accordance with the prior art.

One feature of an embodiment of the securement device 140 described above with reference to FIGS. 2–6 is that the motion of the grip members 150 to align with the upwardly facing interior surface 125 of the workpiece container 120 is independent of, and in a different direction than, the motion required to engage the grip members 150 with the workpiece container 120 and draw the workpiece container 120 toward the support elements 134. An advantage of this feature is that the grip members 150 are more likely to properly engage the workpiece container 120 because axial clearances in the floor aperture 124 the workpiece container 120 are very limited, and axial motion is not wasted simply to move the grip members 150 into position to engage the workpiece container 120. This is unlike some existing devices (such as the one described above with reference to FIG. 1) for which the action of positioning the engaging surfaces to contact the interior of the workpiece container also reduces the axial motion available for clamping the workpiece container to the container support.

A further advantage of embodiments of the securement device 140 is that unlike some existing devices, it can operate with workpiece containers having a wide range of manufacturing variations. For example, because securement devices 140 in accordance with embodiments of the invention have a greater range of available axial motion prior to clamping the workpiece container 120, these securement devices can effectively operate with workpiece containers that are warped or otherwise out of tolerance.

From the foregoing, it will be appreciated that specific embodiments of the invention have been described herein for purposes of illustration, but that various modifications may be made without deviating from the spirit and scope of the invention. For example, other embodiments of the securement device have other arrangements that retain a substantial amount of available axial motion once in position to secure the workpiece container. Still further embodiments have other arrangements for which positioning the securement device for clamping entail motion in one direction, and clamping itself entails motion in another direction. Accordingly, the invention is not limited except as by the appended claims.

I claim:

1. An apparatus for handling microelectronic workpiece containers, comprising:
   a container support having at least one support element positioned to carry a microelectronic workpiece container; and
   a container securement device positioned at least proximate to the at least one support element, the container securement device having at least one contact surface, the at least one contact surface being movable relative to the at least one support element in a first direction between a first position and a second position, with the contact surface contacting or positioned to contact a surface of the microelectronic workpiece container when in the second position, the contact surface further being movable in a second direction from the second position to a third position with the contact surface clamping the microelectronic workpiece container against the at least one support element, wherein the second direction is different than the first direction.

2. The apparatus of claim 1 wherein the at least one contact surface is one of at least two contact surfaces, and wherein the container securement device includes first and second grip members, each having one of the contact surfaces, each grip member being pivotable to move one of the contact surfaces between the first position and the second position.

3. The apparatus of claim 1 wherein the surface of the microelectronic workpiece container bounds an aperture of the microelectronic workpiece container, and wherein the at least one contact surface is positioned to be received in the aperture when in the first position.

4. The apparatus of claim 1 wherein the at least one contact surface is pivotable in the first direction between the first position and the second position, and wherein the at least one contact surface is movable along a generally linear axis from the second position to the third position.

5. The apparatus of claim 1 wherein the securement device is configured to move the at least one contact surface in the first direction without moving the at least one contact surface in the second direction.

6. The apparatus of claim 1 wherein the securement device is configured to move the at least one contact surface in the second direction without moving the at least one contact surface in the first direction.

7. The apparatus of claim 1 wherein the securement device includes:
   a base;
   a grip member support;
   a linear actuator coupled between the base and the grip member support;
   at least one spring coupled between the base and the grip member support to force the grip member support away from the base;
   first and second grip members pivotably coupled to the grip member support, each grip member having an outwardly extending contact portion, each contact portion being pivotable between the first position and the second position; and
   a linkage coupled between the grip members and the linear actuator;
   wherein axial motion of the linear actuator between a first actuator position and a second actuator position pivots the first and second grip members; and wherein axial motion of the actuator between the second actuator position and a third actuator position moves the first and second grip members and the grip member support axially toward the base.

8. The apparatus of claim 1, further comprising:
   a plurality of processing stations positioned at least proximate to the container support; and
   a transfer device positioned to move microelectronic workpieces between the containers and the processing stations.

9. The apparatus of claim 1 wherein the securement device includes:
   a grip member support;
   first and second grip members pivotably coupled to the grip member support, the first and second grip members each having a prong with an outwardly extending contact portion, the contact portions of each of the first and second grip members being pivotable between the first position and the second position; and a third grip member pivotably coupled to the grip member support, the third grip member having a prong with an outwardly extending contact portion, the contact portion of the third grip member being pivotable between the first position and the second position, at least a portion of the prong of the third grip member being received between the prongs of the first and second grip members when the contact portions are in the first positions.

10. The apparatus of claim 1, further comprising a sensor positioned at least proximate to the securement device to detect motion of at least a portion of the securement device in at least one of the first and second directions.

11. The apparatus of claim 1 wherein the at least one contact surface is carried by a grip member pivotably coupled to a grip member support, and wherein the apparatus further comprises a linear actuator coupled to both the grip member and the grip member support, and wherein linear motion of the actuator over a first range pivots the at least one contact surface, and wherein linear motion of the actuator over a second range moves the contact surface along a generally linear path.

12. An apparatus for handling microelectronic workpiece containers, comprising:

container support means for carrying a microelectronic workpiece container; and container securement means for releasably securing a microelectronic workpiece container to the container support means, the container securement means having at least one contact surface, the at least one contact surface being movable relative to the container support means in a first direction between a first position and a second position, with the contact surface contacting or positioned to contact a surface of the microelectronic workpiece container when in the second position, the contact surface further being movable in a second direction from the second position to a third position with the contact surface clamping the microelectronic workpiece container against the container support means, wherein the second direction is different than the first direction.

13. The apparatus of claim 12 wherein the container securement means includes first and second grip members, each grip member having a contact surface, and wherein the contact surfaces are pivotable between the first and second positions.

14. The apparatus of claim 12 wherein the container securement means includes first and second grip members, each grip member having a contact surface, and wherein the contact surfaces are movable along generally linear paths between the second and third positions.

15. A method for manufacturing an apparatus for handling microelectronic workpiece containers, comprising:

providing a container support having at least one support element positioned to carry a microelectronic workpiece container; and positioning a container securement device at least proximate to the at least one support element, the container securement device having at least one contact surface, the at least one contact surface being movable relative to the at least one support element in a first direction between a first position and a second position, with the contact surface contacting or positioned to contact a surface of the microelectronic workpiece container when in the second position, the contact surface further being movable in a second direction from the second position to a third position with the contact surface clamping the microelectronic workpiece container against the at least one support element, wherein the second direction is different than the first direction.

16. The method of claim 15, further comprising:

pivotably coupling a plurality of grip members to a grip member support, with each grip member having a contact surface that is pivotable between the first and second positions; and coupling a linear actuator to the grip member support.

17. The method of claim 15, further comprising pivotably coupling a plurality of grip members to a grip member support, with each grip member having a contact surface that is movable between the first and second positions.

18. The method of claim 15 wherein positioning a container securement device includes positioning a container securement device having the at least one contact surface being pivotable in the first direction between the first position and the second position, and wherein the at least one contact surface is movable along a generally linear axis from the second position to the third position.

19. The method of claim 15, further comprising:

coupling a linear actuator between a base and a grip member support;

positioning at least one spring between the base and the grip member support to force the grip member support away from the base;

pivotably coupling first and second grip members to the grip member support, each grip member having an outwardly extending contact portion, each contact portion being pivotable between the first position and the second position; and coupling a linkage between the grip members and the linear actuator;

wherein axial motion of the linear actuator between a first actuator position and a second actuator position pivots the first and second grip members; and wherein axial motion of the actuator between the second actuator position and a third actuator position moves the first and second grip members and the grip member support axially toward the base.

20. The method of claim 15, further comprising:

positioning a plurality of processing stations at least proximate to the container support; and disposing a transfer device between at least one of the processing stations and the container support, the transfer device being configured to move microelectronic workpieces between the container support and the at least one processing station.

21. The method of claim 15, further comprising:

pivotably coupling first and second grip members to a grip member support, the first and second grip members each having a prong with an outwardly extending contact portion, the contact portions of each of the first and second grip members being pivotable between the first position and the second position; and pivotably coupling a third grip member to the grip member support, the third grip member having a prong with an outwardly extending contact portion, the contact portion of the third grip member being pivotable between the first position and the second position, at least a portion of the prong of the third grip member being received between the prongs of the first and second grip members when the contact portions are in the first positions.

22. The method of claim 15, further comprising disposing a sensor at least proximate to the securement device to detect motion of at least a portion of the securement device in at least one of the first and second directions.

23. The method of claim 15, wherein the at least one contact surface is carried by a grip member pivotably coupled to a grip member support, and wherein the method further comprises coupling a linear actuator to both the grip member and the grip member support, and wherein linear motion of the actuator over a first range pivots the at least one contact surface, and wherein linear motion of the actuator over a second range moves the contact surface along a generally linear path.

24. A method for securing a microelectronic workpiece container to a container support, comprising:
    contacting the microelectronic workpiece container with a support element of the container support;
    moving at least one contact surface of a securement device from a first position to a second position with the at least one contact surface contacting or positioned to contact a surface of the microelectronic workpiece container when in the second position; and
    drawing the microelectronic workpiece container toward the support element with a second motion of the at least one contact surface in a second direction different than the first direction.

25. The method of claim 24 wherein moving the at least one contact surface in a first direction includes pivoting the at least one contact surface.

26. The method of claim 24 wherein moving the at least one contact surface in the second direction includes moving the at least one contact surface in a generally linear direction.

27. The method of claim 24 wherein the at least one contact surface is one of at least two contact surfaces, and wherein moving at least one contact surface includes pivoting a first contact surface in a first direction and pivoting a second contact surface in a second direction opposite the first direction.

28. The method of claim 24, further comprising moving the at least one contact surface to the first position, with the at least one contact surface located within an aperture of the microelectronic workpiece container when in the first position.

29. The method of claim 24, further comprising:
    supporting a grip member support relative to a base;
    forcing the grip member support away from the base with a spring;
    pivoting first and second grip members relative to the grip member support between a first position and a second position to contact outwardly extending contact portions of each grip member with the microelectronic workpiece container, by moving an actuator coupled to the grip members between a first actuator position and a second actuator position; and
    moving the actuator from the second actuator position to a third actuator position to move the first and second grip members and the grip member platform axially toward the base and clamp the microelectronic workpiece container.

* * * * *